(12) United States Patent
Oppelt

(10) Patent No.: US 6,255,821 B1
(45) Date of Patent: Jul. 3, 2001

(54) NUCLEAR MAGNETIC RESONANCE TOMOGRAPHY DEVICE AND METHOD FOR ITS OPERATION

(75) Inventor: Arnule Oppelt, Spardorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/401,484

(22) Filed: Sep. 22, 1999

(30) Foreign Application Priority Data

Sep. 22, 1998 (DE) .............................. 198 43 463

(51) Int. Cl.[7] ....................................... G01V 3/00
(52) U.S. Cl. .................. 324/318; 324/309; 324/307
(58) Field of Search .................... 324/309, 318, 324/307; 600/410

(56) References Cited

U.S. PATENT DOCUMENTS 5,842,980 * 12/1998 Tsuda ................................ 600/410

FOREIGN PATENT DOCUMENTS 40 04 184 8/1990 (DE) .
42 25 592 2/1994 (DE) .

OTHER PUBLICATIONS

"Electrostimulation By Time–Varying Magnetic Fields," Irnich, MAGMA, vol. 2, (1994), pp. 43–49.

* cited by examiner

Primary Examiner—Christine Oda
Assistant Examiner—Brij B. Shrivastav
(74) Attorney, Agent, or Firm—Schiff Hardin & Waite

(57) ABSTRACT

In a nuclear magnetic resonance tomography device the examination volume is divided in at least one spatial direction into at least two successive segments, and the gradient coil system is fashioned such that the magnet field gradient alternates in this spatial direction. A separate subsystem of the antenna system is allocated to each segment for the transmission of excitation signals and/or the reception of magnetic resonance signals.

11 Claims, 3 Drawing Sheets

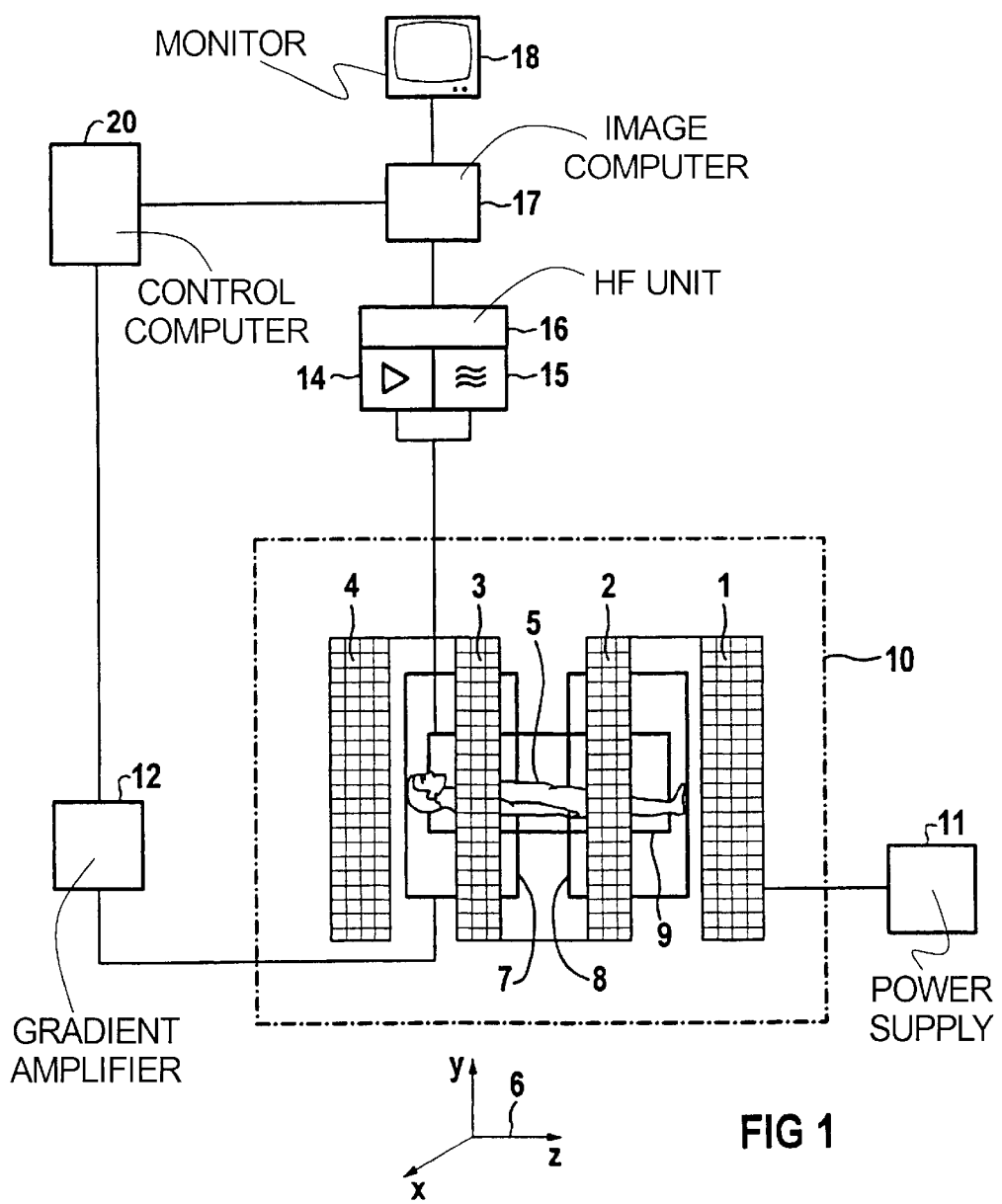
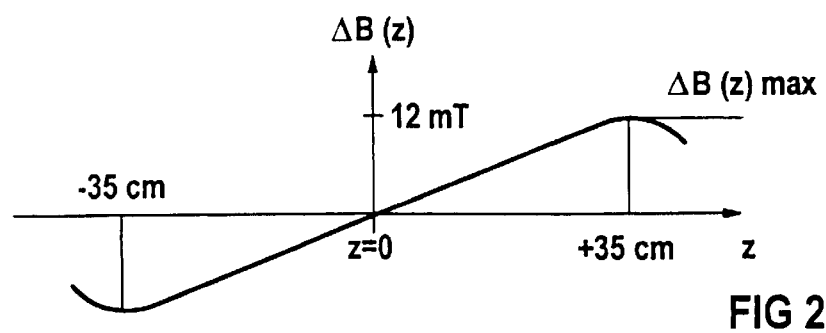

NUCLEAR MAGNETIC RESONANCE TOMOGRAPHY DEVICE AND METHOD FOR ITS OPERATION

BACKGROUND OF THE INVENTION

1. Field of the Invention

The present invention is directed to a nuclear magnetic resonance tomography device of the type having a basic field magnet and a gradient coil system for the generation of magnet field gradients in three spatial directions disposed perpendicularly to one another and an antenna system for transmitting high-frequency pulses and for the reception of magnetic resonance signals from an examination volume. The invention also is directed to a method for operating a magnetic resonance tomography device.

2. Description of the Prior Art

Different magnetic fields and electromagnetic fields are employed in magnetic resonance tomography. The examination object lies in a strong magnet field of approximately 0.2 through 4 T. High-frequency fields in the range of 10 through 160 MHZ are utilized for the excitement of the nuclear spins. Magnetic field gradients, i.e., location-dependent magnet fields are superimposed onto the basic magnet field for spatial resolution. The magnet field gradients are multiply switched within a pulse sequence for the excitation and selection of the magnetic resonance signals. Magnet field gradients with a short rise time and a high intensity are necessary for images with high spatial resolution and short measuring time.

A magnetic resonance tomography device of the type mentioned above is known from German OS 40 04 184, for example.

The time-dependent magnet field gradients induce currents in conductive parts. This is true not only for metallic items built into the examination space of the magnetic resonance tomography device, but also is basically true for the examination object. Given short rise times and high amplitudes, peripheral nerve stimulations can occur in persons to be examined, these nerve stimulations mainly being manifested by muscle convulsions. The examined persons described these stimulations as convulsions in the buttock region, back region and also in the nose root, depending on the examined part of the body. Given gradient intensities of 15 mT/m with rise times up to 500 W$\mu$/s, aggravating stimulation problems generally do not result. When the gradient intensity and/or the switching time and further intensified physiological borders are reached, since painful stimulations can then occur. As shown by W. Irnich in the publication "Electrostimulation by time-varying magnetic fields", in MAGMA 2 (1994), 43–49, the stimulation threshold is thereby given by the critical change of the magnetic field intensity $\Delta B$. The absolute value of the magnetic field intensity change therefore determines the stimulation threshold, rather than one of the magnetic field gradient given fixed switching times.

In order to prevent peripheral muscle stimulations, the extent $z_{max}$ of the magnet field gradient in the longitudinal axis of the measuring object is usually limited, however, the imaging field is also limited as a result. This results in areas of the object that are desired to be imaged not being able to be shown in an examination, even when the spatial expanse of the homogeneity volume of the basic field would allow this.

To address the aforementioned stimulation problem, German OS 42 25 592 suggests to cover stimulation-sensitive areas outside the examination area with a closed conductor loop. According to this published patent application, the stimulation problem mainly exists in the direction of the longitudinal axis of the magnet in magnetic resonance tomography devices wherein the patient is surrounded by ring-shaped magnet coils (typically given superconducting magnet constructions). This direction, which coincides with the lengthwise direction of the examination object, is usually referred to as the z-direction. The technique of covering stimulation-sensitive areas outside of the examination area makes the handling of the magnetic resonance tomography device more difficult.

SUMMARY OF THE INVENTION

An object of the present invention is to provide a magnetic resonance tomography device and a method for its operation wherein pulse sequences with an extremely short measuring time and a high spatial resolution can be used without the danger of peripheral stimulations.

The above object is achieved in accordance with the principles of the present invention in a magnetic resonance tomography device and a method for operating a magnetic resonance tomography device wherein a magnetic field gradient is employed to divide the examination volume along at least one spatial direction into at least two successive segments, by means of this magnetic field gradient alternating along the aforementioned spatial direction, and wherein the high-frequency transmission/reception antenna system has a plurality of antenna sub-systems respectively allocated to the segments, each antenna sub-system having a different sensitivity, the respective sensitivities being segment-dependent.

Compared to conventional gradients having the same rise time and the same intensity, in accordance with the invention, corresponding to the number of the segments, a low absolute value of the maximal magnetic field intensity change by a magnet field gradient that alternates segment-by-segment is obtained. However, as explained above, this value determines the stimulation threshold. The available imaging field thus is not limited. Further, additional manipulations at the patient are not necessary.

DESCRIPTION OF THE DRAWINGS

FIG. 1 schematically illustrates the basic components of a magnetic resonance tomography device FIG. 2 shows the conventional course of the magnetic field in z-direction.

DESCRIPTION OF THE PREFERRED EMBODIMENTS

Figure 3:
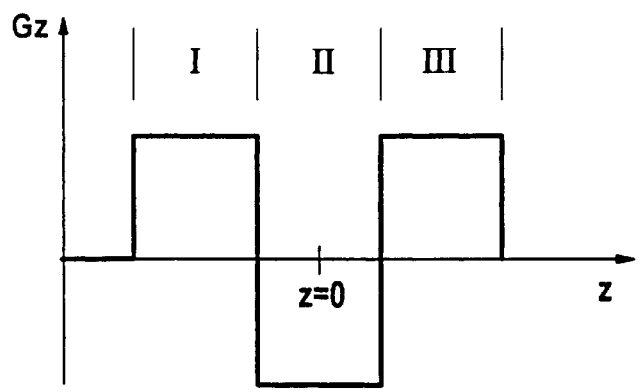
FIG. 3 shows a gradient alternating in the z-direction, for the ideal case in accordance with the invention.

The following exemplary embodiment of the invention refers to a magnet system wherein the examination object is surrounded by closed-loop coils, as is typically used with superconducting magnets. However, the following explanations can easily be transferred to pole shoe magnets, such as C-shaped magnets, for example.

As already explained above, the problem of stimulations mainly occurs in longitudinal direction of the examination object, this longitudinal direction coinciding with the magnet axis given the type of magnets described herein and which is usually referred to as the "z-direction". However, it must be pointed out that the measures explained below can be, in principle, applied in all spatial directions.

FIG. 1 schematically shows the components of a magnetic resonance tomography device. This includes a magnet system 1 through 4 that generates a homogenous basic field, this magnet system being driven by a current supply 11. Gradient coil systems 7, 8, which are triggered by a gradient amplifier 12, are provided in the magnet system. The gradient coil systems are implemented in three spatial directions x, y, z of a system of coordinates 6 for the generation of magnet field gradients. The z-direction is also defined as the direction of the basic magnet field in the subsequent description. The z-direction also represents the longitudinal direction of the examination object; in this case, it represents the longitudinal direction of a patient 5.

The examination object 5 is surrounded by a high-frequency transmission antenna and a high-frequency reception antenna 9, which is connected to a high-frequency transmission unit 14 and to a high-frequency reception unit 15. The high-frequency transmission unit 14 and the high-frequency reception unit 15 are components of a high-frequency system 16 in which, among other things, the received signals are scanned and demodulated phase-sensitively. An image that is displayed on a monitor 18 is represented from the demodulated signals an image computer 17. The entire unit is controlled by a control computer 20.

FIG. 2 shows the conventional course of the basic magnet field B(z) given switched-on magnet field gradients Gz in the z-direction. As explained above, the maximum field intensity $\Delta B_{max}$ is controlling with respect to the stimulation due to the magnet field gradient, given fixed switching times. Given a linear magnet field, which is desired in the imaging field, the value $Gz_{max}$ is proportional to the location z and to the gradient intensity Gz=dB(z)/dz. As is known, the linearity region is limited to the standard imaging field within a sphere with a diameter of 20 through 25 cm in the symmetry center of the device, so that $\Delta B_{max}$ does not needlessly increase. The magnet field gradient Gz becomes lower or even negative outside of the imaging field.

Given such conventional magnet field gradients, borders are reached wherein a stimulation occurs that is no longer tolerable given short rise times and/or high gradient amplitudes. The value $Gz_{max}$ could only be reduced by a reduction of the gradient intensity $G_z$ or by a reduction of the imaging window. However, a smaller magnet field gradient Gz also causes a lower spatial resolution. A reduction of the imaging field means that areas of the object to be imaged cannot be presented in an examination, i.e. without displacing the object in the z-direction, even when the spatial extent of the homogeneity volume of the basic magnet field would allow imaging.

Figure 4:
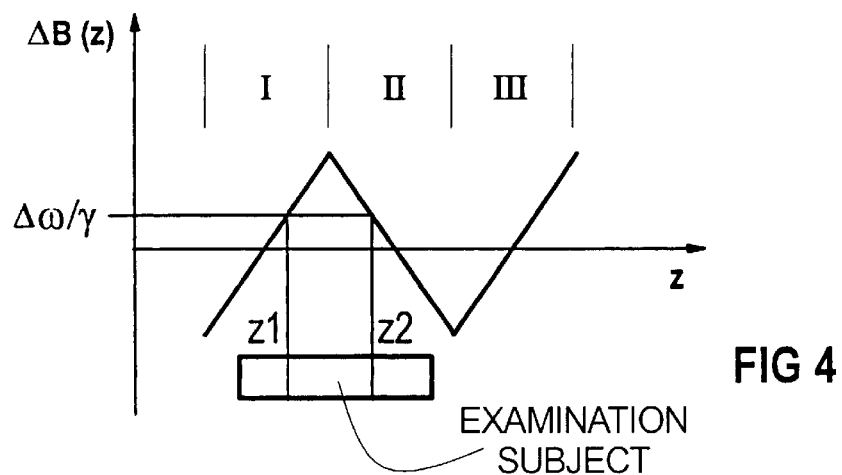
FIG. 4 shows the magnetic field course in the z-direction resulting from the gradient shown in FIG. 3.

In order to solve the problem of stimulation without limitation as to the spatial resolution or reduction of the imaging field, the measuring object is inventively exposed to a magnet field gradient that is spatially alternating, instead of being exposed to a magnet field gradient that is spatially constant. In the example according to FIG. 3, the imaging field is therefore divided in the z-direction in three segments I through III, with the direction of the magnet field gradient Gz alternating from segment to segment. (The imaging field obviously is not physically or structurally "divided" into the aforementioned segments. A desired segment size can be decided upon and then the field gradient Gz can be appropriately designed, or conversely the gradient Gz can be designed first, which thus "defines" the segments.) FIG. 4 shows the course of the magnet field $\Delta B(z)$ associated therewith in the z-direction. It can be seen that lower maximum values of the time-varying magnet field $\Delta B(z)$ maxoccur given same gradient intensity Gz=dB(z)/dz, compared to a gradient Gz that is constant over the z-axis. Generally, the maximum value $\Delta B(z)_{max}$ becomes smaller in relation to the number of the selected segments, i.e. one third as big in the example according to FIG. 4 compared to the example according to FIG. 2. Expediently, the number of segments is selected such that a stimulation of the patient does not occur given this maximum value $\Delta B(z)_{max}$.

As is known, a spatial resolution is achieved in magnetic resonance tomography because the resonant frequency of the nuclear spins is proportional to the magnet field at the location of the respective nuclear spin. The proportionality factor is known as the gyromagnetic ratio. This proportionality is utilized not only given selective excitation but also given frequency-encoded selection of nuclear magnetic resonance signals. However, a clear interrelationship is no longer present between the resonant frequency and location given application of an alternating gradient. As can be seen from FIG. 4, for example, the same magnet field prevails at the locations z1 and z2 and that nuclear spins from these two locations exhibit the same resonance frequency. Therefore, spins at the locations z1 and z2 cannot be differentiated with conventional MR devices given excitement and also cannot be differentiated given selection.

In order to be able to make a clear allocation of each nuclear magnetic resonance signal to its location, a number of high-frequency antennae whose respective sensitivity profiles in the z-direction conforms with the expanse of the individual segments I through III in an optimally exact manner are utilized for reception of the nuclear magnetic resonance signal. This is indicated in the exemplary embodiment according to FIG. 6 by three high-frequency coils 22 through 24 that are offset in the direction of the z-axis. However, due to physical reasons, it is not possible to fashion reception coils such that nuclear magnetic resonance signals are exclusively received from the allocated segment. Therefore, the reception field of view of each high-frequency coil 22 through 24 not only receives nuclear magnetic resonance signals from the allocated segment, but also receives (somewhat attenuated) nuclear magnetic resonance signals from the neighboring segment. However, the high-frequency coils 22 through 24 that are allocated to the neighboring segment also receives signals from the segment under consideration, so that the crosstalk of image signals from neighboring segments can be corrected as shown in the following when the sensitivity course of the reception coils 22 through 24 across the location is known. To that end, let it be assumed according to FIG. 4 that a first high-frequency reception coil receives nuclear magnetic resonance signals S1 with the location coordinate z1 and, given a frequency $\Delta \omega$, receives nuclear magnetic resonance signals of the same frequency with the location coordinate z2 with a sensitivity reduced by $\epsilon$. A second high-frequency coil that is allocated to the segment II receives nuclear magnetic resonance signals S2 from the location coordinate z2 and, with a sensitivity reduced by $\epsilon$, it receives nuclear magnetic resonance signals from the location coordinate z1.

The following equations apply:

$$S1(\Delta\omega)=f(z1)+\epsilon f(z2)$$

$$S2(\Delta\omega)=f(z2)+\epsilon f(z1)$$

As explained above, the sensitivity profile ε that is the same for both high-frequency reception coils is known. Then the signal contributions f(z1) and f(z2) of the z-coordinates can be calculated from the reception signals according to:

$$f(z1) = \frac{S1 - \varepsilon S2}{1 - \varepsilon^2}$$

$$f(z2) = \frac{S2 - \varepsilon S1}{1 - \varepsilon^2}$$

The signal contributions from different z-coordinates can be correspondingly coordinated given utilization of more than two high-frequency reception coils.

Figure 5:
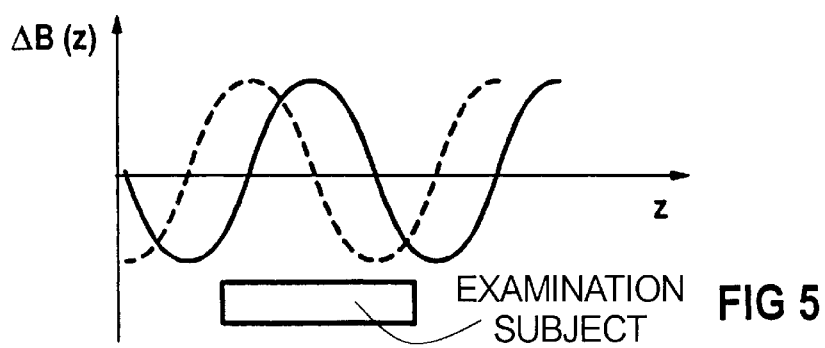
FIG. 5 shows the real course of the magnetic field in the z-direction.

The following problem should also be pointed out. Given the illustration according to the FIGS. 3 and 4, it was assumed that a polarity change between the segments takes place without transition, i.e. that the magnet field change ΔB(z) exhibits a sawtooth-shaped course. However, such a field course cannot be realized due to physical reasons, since the transition of the gradients must be steady. In reality, therefore, a field course ΔB(z) arises as shown in FIG. 5 with a solid line. This field course is only linear in sections and approximately exhibits a sine shape. Given transition between the segments, the field course in the z-direction is flat, so that a spatial resolution cannot be achieved in this region. This causes image gaps to occur in the overall image, which is derived from the sub-images from the reception signals of the high-frequency reception coils allocated to the respective segments I through III. These segments become narrower as the number of segments increases. When these image gaps cannot be tolerated, a second gradient field, as it is shown in FIG. 5 in broken lines, is provided. This second gradient field exhibits a course that is identical with respect to the course of the first gradient field, however, it is offset in the z-direction by one segment width compared to the first one. The MR signal acquisition is then conducted twice, namely once with the first gradient field and once with the second gradient field. As can be seen from FIG. 5, the image gaps that arise at the location of the polarity changes of the gradient field are overlapped.

Two possibilities are proposed as examples for the realization of the gradient field offset by half of a segment width. In the simplest case, the measuring object is displaced by half of a segment width and a second image is made that supplements the first image in the shown way. Without mechanical displacement, however, a more complicated solution is to employ a second gradient coil system with a correspondingly offset gradient field for the magnet field gradient in the z-direction.

The second signal acquisition serves the purpose of covering the aforementioned image gaps. Two measuring signals for each image pixel over wide areas. This fact can, in turn, be used in two ways. An improved signal-to-noise ratio can be achieved by averaging the two signals that are available to an image pixel. The two gradient fields alternatively can be applied such that two superimposed images arise with a scanning raster that is displaced by half a pixel-length. Apart from the image gaps that are present regarding each signal, the resolution of the image in the z-direction is doubled.

Figure 6:
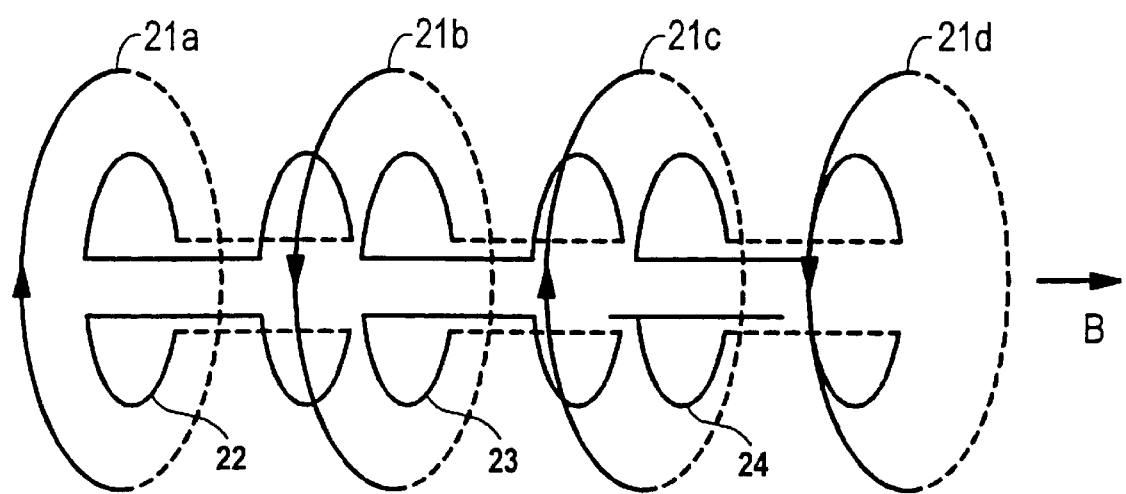
FIG. 6 schematically illustrates an example for the arrangement of gradient coils and high-frequency antennae in accordance with the invention.

FIG. 6 schematically shows an example for a gradient coil system for the generation of a z-gradient that is spatially alternating. For three segments, the gradient coil system has four individual coils 21a–21d with alternating current directions. A magnet field gradient in the z-direction, which has the course shown in FIG. 5, is impressed on the basic magnet field in the z-direction. Further details with respect to the design of such a gradient coil system can be found in U.S. Pat. No. 4,468,622, for example.

For the above given case of two gradient fields that are offset by a segment width, the shown gradient coil system can, again, be provided with an offset by half a segment width in the z-direction.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance tomography device comprising:
    a basic field magnet which generates a basic magnetic field;
    a gradient coil system which generates respective magnetic field gradients in three orthogonal spatial directions;
    an antenna system which transmits high-frequency pulses into an examination volume and which receives nuclear magnetic resonance signals from said examination volume;
    said gradient coil system generating an alternating magnetic field gradient along one of said spatial directions and thereby dividing said examination volume into at least two successive segments; and
    said antenna system comprising a plurality of antenna sub-systems, equal in number to said segments, the antenna sub-systems respectively being allocated to said segments and each antenna sub-system transmitting into, and receiving from, the segment allocated thereto, said antenna sub-systems respectively having different, segment-dependent sensitivities.

2. A magnetic resonance tomography device as claimed in claim 1 wherein said basic field magnet comprises a plurality of closed-loop coils having respective coil axes which define a direction of said basic magnetic field, said direction of said basic magnetic field coinciding with said one of said orthogonal spatial directions.

3. A magnetic resonance tomography device as claimed in claim 1 wherein said gradient coil system comprises coil loops respectively supplied with oppositely-directed current, said coil loops being spaced from each other along said one of said orthogonal spatial directions for generating said alternating magnetic field gradient.

4. A magnetic resonance tomography device as claimed in claim 1 wherein each of said segments has a predominating resonant frequency, and wherein the respective sub-antenna systems are tuned to the respective predominating resonant frequencies to produce said segment-dependent sensitivity.

5. A magnetic resonance tomography device as claimed in claim 1 wherein said gradient coil system comprises a first gradient coil system and a second gradient coil system spaced from said first gradient coil system along said one of said orthogonal spatial directions for generating said alternating magnetic field gradient.

6. A magnetic resonance tomography device as claimed in claim 5 wherein said second gradient coil system is spaced from said first gradient coil system by one-half of a length of a segment.

7. A method for operating a magnetic resonance tomography device, comprising the steps of:
    generating a basic magnetic field;
    generating gradient magnetic fields respectively oriented along three orthogonal spatial directions within said basic magnetic field;

transmitting high-frequency signals into an examination volume in said basic magnetic field and in said magnetic field gradients and thereby exciting nuclear spins in said examination volume, and receiving nuclear magnetic resonance signals from said examination volume resulting from said nuclear spins;

dividing said examination volume into at least two successive segments by generating one of said magnetic field gradients along one of said orthogonal spatial directions with alternating polarity;

individually and receiving said magnetic resonance signals from the respective segments with respective, different segment-dependent sensitivities; and combining the separately-received nuclear magnetic resonance signals from the respective segments to form an overall image from said examination volume.

8. A method as claimed in claim 7 comprising, for each image, conducting two measurements within said examination volume and respectively employing gradient fields in said two measurements which are offset from each other along said one of said orthogonal spatial directions.

9. A method as claimed in claim 8 comprising offsetting said gradient magnetic fields by half of a segment-length along said one of said orthogonal spatial directions.

10. A method as claimed in claim 8 comprising obtaining a pixel raster in each measurement, and shifting one pixel raster by half of a pixel length relative to the other pixel raster, to produce said image with a spatial resolution which is doubled along said one of said orthogonal spatial directions compared to either one of said two measurements.

11. A method as claimed in claim 7 comprising disposing an examination subject in said examination volume and obtaining said nuclear magnetic resonance signals from said examination subject at a first location in said examination volume, displacing said examination subject in said examination volume along said one of said orthogonal spatial directions, and obtaining further magnetic resonance signals from said examination subject.

* * * * *